United States Patent
Barthelmess et al.

(10) Patent No.: US 6,696,705 B1
(45) Date of Patent: Feb. 24, 2004

(54) POWER SEMICONDUCTOR COMPONENT HAVING A MESA EDGE TERMINATION

(75) Inventors: Reiner Barthelmess, Eltmann (DE); Gerhard Schmidt, Forchheim (DE)

(73) Assignee: Eupec Europaeische Gesellschaft fuer Leistungshalbleiter mbH & Co. KG, Warstein-Blecke (DE)

(*) Notice: Subject to any disclaimer, the term of this patent is extended or adjusted under 35 U.S.C. 154(b) by 0 days.

(21) Appl. No.: 09/660,276

(22) Filed: Sep. 12, 2000

Related U.S. Application Data

(63) Continuation of application No. PCT/DE00/00086, filed on Jan. 12, 2000.

(51) Int. Cl.[7] .................. H01L 29/861; H01L 29/74; H01L 23/58; H01L 29/06; H01L 31/075

(52) U.S. Cl. .................. 257/104; 257/139; 257/147; 257/170; 257/171; 257/496; 257/586; 257/646; 257/618; 257/623; 257/626; 257/656

(58) Field of Search .................. 257/335, 138, 257/139, 147, 170, 171, 618, 623, 626, 656, 586, 496, 104, 106, 497, 498, 551, 646

(56) References Cited

U.S. PATENT DOCUMENTS

| | | | | |
|---|---|---|---|---|
| 4,680,615 A | * | 7/1987 | Götzenbrucker et al. | ... 257/170 |
| 5,039,358 A | * | 8/1991 | Birkle et al. | ........ 257/646 |

FOREIGN PATENT DOCUMENTS

| | | | |
|---|---|---|---|
| EP | 0 144 876 B1 | 6/1985 | .......... 257/104 |
| EP | 0 400 178 A1 | 12/1990 | .......... 257/170 |
| JP | 55-26670 | * 2/1980 | .......... 257/170 |
| WO | WO 97/12403 | 4/1997 | .......... 257/104 |

\* cited by examiner

*Primary Examiner*—Steven Loke
(74) *Attorney, Agent, or Firm*—Laurence A. Greenberg; Werner H. Stemer; Ralph E. Locher

(57) ABSTRACT

A power semiconductor component having a mesa edge termination is described. The component has a semiconductor body with first and second surfaces. An inner zone of a first conductivity type is disposed in the semiconductor body. A first zone is disposed in the semiconductor body and is connected to the inner zone. An edge area outside of the first zone has areas etched out. A second zone of a second conductivity type is disposed in the semiconductor body and is connected to the inner zone, and a boundary area between the second zone and the inner zone defines a pn junction. A field stop zone is adjacent the first surface in the edge area. The field stop zone is formed of the first conductivity type and is embedded in the semiconductor body, and the field stop zone is connected to the first zone and to the inner zone.

11 Claims, 2 Drawing Sheets

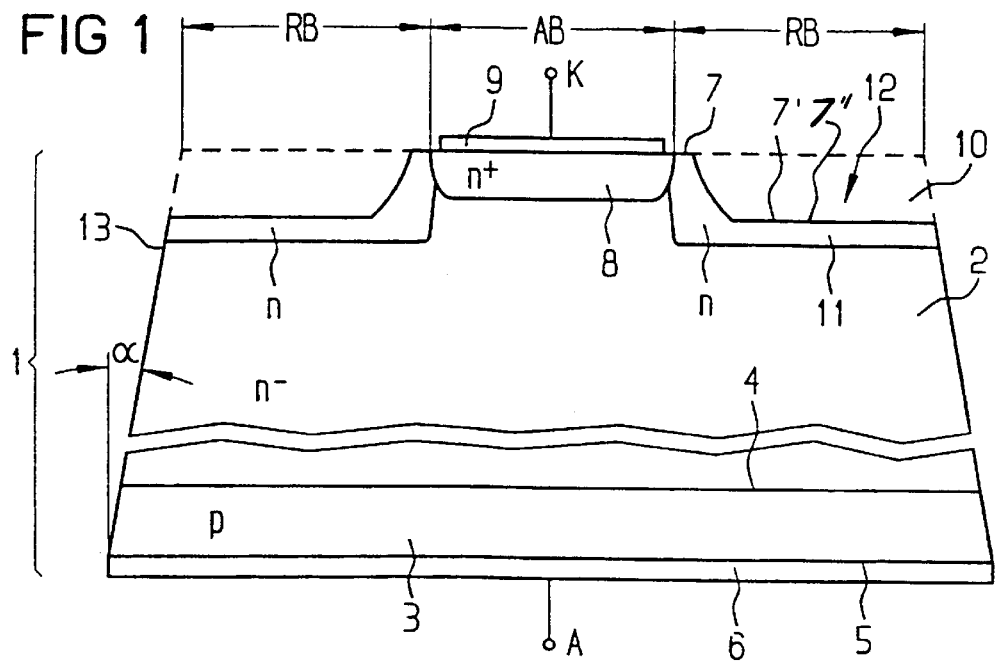
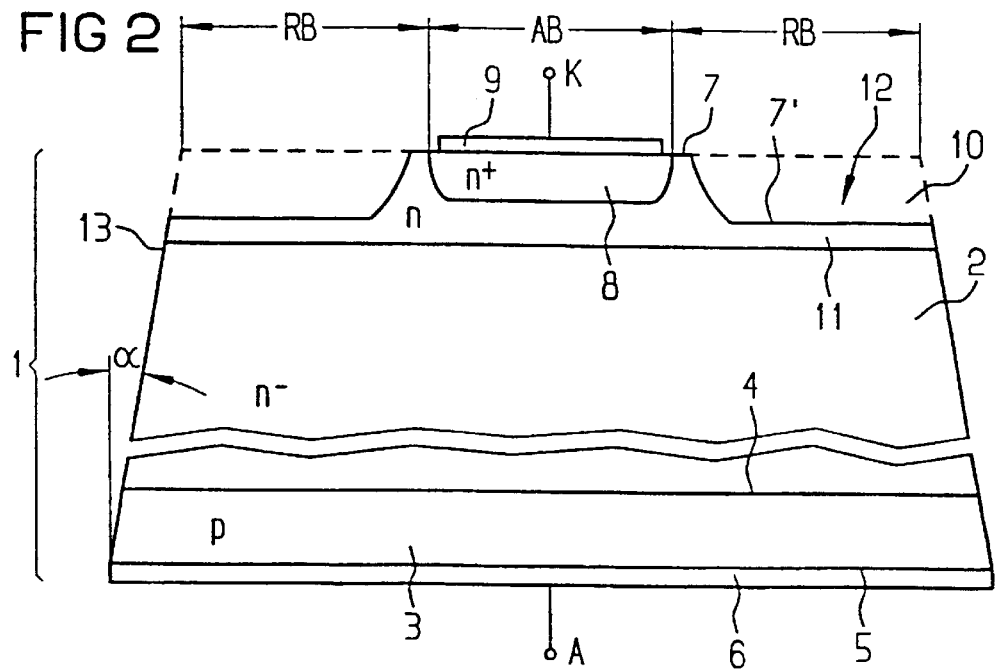

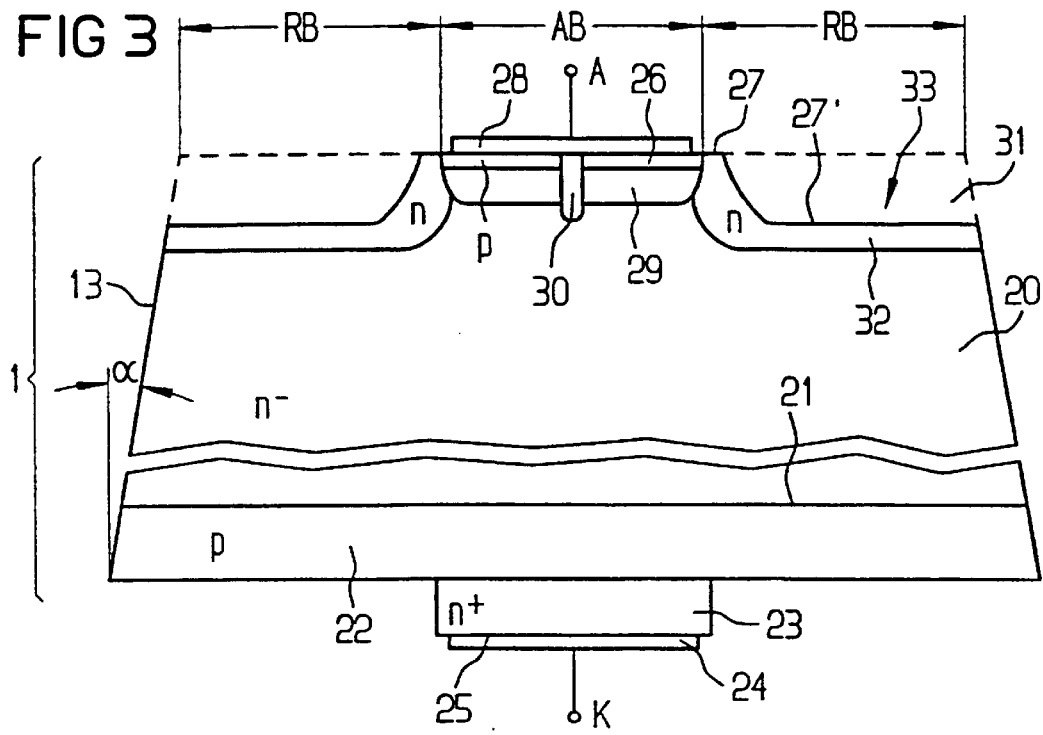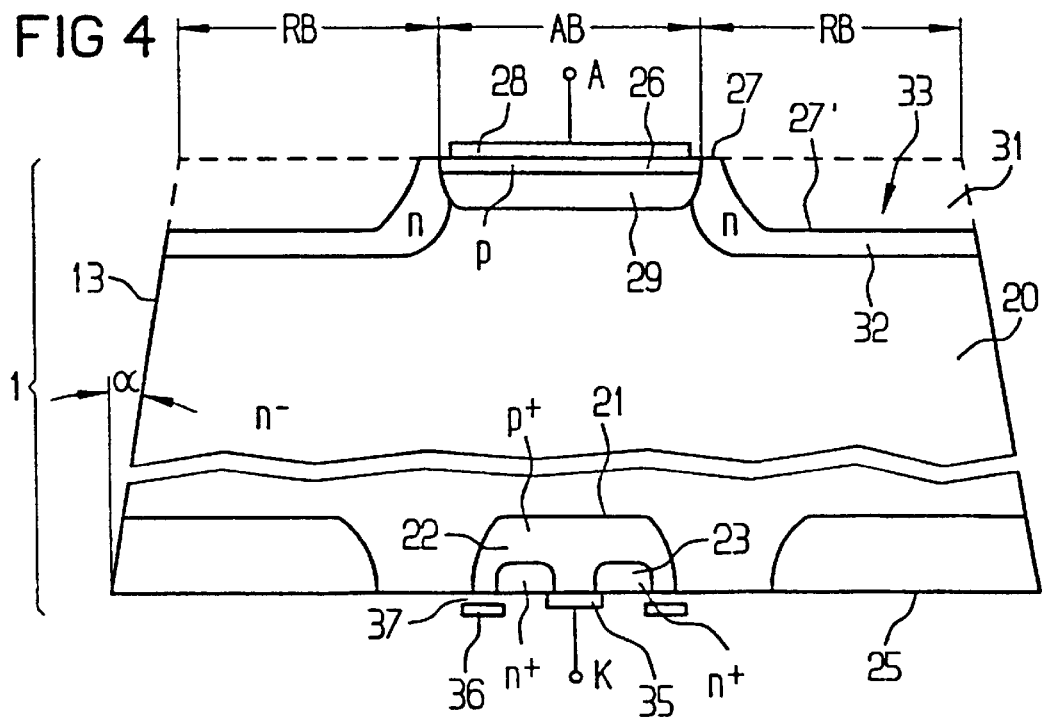

POWER SEMICONDUCTOR COMPONENT HAVING A MESA EDGE TERMINATION

CROSS-REFERENCE TO RELATED APPLICATION

This is a continuation of International Application PCT/DE00/00086, filed Jan. 12, 2000, which designated the United States.

BACKGROUND OF THE INVENTION

Field of the Invention

The invention relates to an asymmetrically blocking power semiconductor component having a mesa edge termination.

The present invention relates in particular to asymmetrically blocking (that is to say blocking on one side), high-voltage-resistant power semiconductor components with a so-called mesa edge termination, that is to say with a chamfer on the side walls. The invention also relates in particular to those power semiconductor components having so-called punch through dimensioning, that is to say with a field stop zone in order to reduce the electrical field. Such power semiconductor components may, for example, be in the form of pin diodes, gate turn-off thyristors (GTOs), insulated gate bipolar transistors (IGBTs) or the like.

A major criterion for the quality of such power semiconductor components is their emitter efficiency. In order to achieve an emitter efficiency which is as high as possible, the emitter zone must be as highly doped as possible. However, at the same time, it is necessary for the space charge zone to run over as long a distance as possible on the wafer surface in switched-off operation. In order to increase the available distance on the wafer surface for the space charge zone, the side edge of the semiconductor body typically has a positive chamfer.

However, as a rule, this measure is insufficient for high-blocking capable power semiconductor components. For this reason, wide parts are typically etched out of the semiconductor surface in the edge area of the power semiconductor components, that is to say outside their active areas. Although the etched shoulders produced in this way further enlarge the free distance available for the space charge zone, the overall charge carrier concentration required for voltage breakdown on the semiconductor surface is, however, at the same time reduced since the emitter zone is in consequence reduced.

The complete removal of the heavily doped emitter zone in the edge area leads, with punch through dimensioning, to very high field strength peaks on the wafer surface in the area of the etched shoulders since the breakdown charge required to achieve the full blocking capability—in the case of silicon, this is about $10^{12}$ cm$^{-2}$—is no longer present here. If this field strength exceeds the critical breakdown field strength, which is typically between 170 and 220 kV cm$^{-1}$ for silicon, undesirable, that is to say premature, breakdown of the semiconductor structure occurs in the edge area, even at low voltages.

In order to prevent such an undesirable breakdown occurring in the edge area in power semiconductor components of this generic type, it is necessary to ensure that the integral of the ionization on the surface there is always less than in the volume, that is to say the undesirable field peaks of the electrical field must be reduced there.

One conventional method for building up additional charges in the edge area and for reducing the field peaks is to use electroactive passivation layers composed, typically, of amorphous carbon layers containing hydrogen, or of amorphous silicon-carbide layers containing hydrogen. European Patent EP 0 400 178 B1 describes a method for electroactive passivation. The advantage of this method is that charges can be built up actively in the amorphous layer precisely where they can weaken field strength peaks to a certain extent in a self-adjusting manner.

However, this measure on its own is no longer sufficient for the development of very low-loss power semiconductor components.

In particular, the charge density of the surface charges decreases with temperature, so that it is no longer possible to ensure an adequate blocking capability, particularly at very low temperatures.

SUMMARY OF THE INVENTION

It is accordingly an object of the invention to provide a power semiconductor component having a mesa edge termination which overcomes the above-mentioned disadvantages of the prior art devices of this general type, whose edge area remains functional even in extreme conditions, and which ensures the full blocking capability of the semiconductor component.

With the foregoing and other objects in view there is provided, in accordance with the invention, a power semiconductor component having a mesa edge termination. The component has a semiconductor body with first and second surfaces. An inner zone of a first conductivity type is disposed in the semiconductor body. A first zone is disposed in the semiconductor body and is connected to the inner zone and is adjacent the first surface of the semiconductor body.

The semiconductor body has an edge area outside of the first zone and areas are at least partially etched out from the first surface and formed in the edge area. A second zone of a second conductivity type is disposed in the semiconductor body and is connected over a large area to the inner zone, and a boundary area between the second zone and the inner zone defines a pn junction. A field stop zone is adjacent the first surface in the edge area. The field stop zone is formed of the first conductivity type and embedded in the semiconductor body, and the field stop zone is connected to the first zone and to the inner zone.

According to the invention, the field stop zones of the same conductivity type as in the inner zone are provided in the edge area underneath the areas (etched shoulders) which are etched out of the semiconductor body. The field stop zones, which are typically connected to the inner zone and to the emitter zone, are adjacent to the etched-polished, damage-free surface of the etched-out shoulders. The dopant concentration in the field stop zones, which is between the concentration in the emitter zone and the concentration in the inner zone, is in this case set so as to produce a decreasing gradient in the concentration profile of the doping from the surface of the etched shoulders into the depth of the semiconductor body. In this way, it is possible even in extreme conditions to ensure that the semiconductor component does not break down in an unintended way before the predetermined breakdown voltage is reached.

The profile of the dopant concentration is set in the edge area such that the breakdown charge results after etching away a minimum thickness, which is necessary to produce an etched-polished, damage-free surface. This is virtually independent of the depth or thickness of the emitter zone. The dopant concentration in the field stop zone, and its depth, must in this case be set such that, with respect to the vertical direction, the surface-related charge carrier density measured from the field stop zone and the inner zone located underneath is approximately the same as the breakdown charge density. The dopant concentration and the amount of charge carriers introduced in the field stop zone can in this case be set or controlled deliberately by ion implantation.

Alternatively, it would also be feasible to provide the field stop zone not only in the edge area, but to dispose it over a large area, in each case under the emitter zone and directly under the etched-out areas in the edge area.

In principle, it is also feasible for the etched-out areas on the wafer surface not to run in the ideal horizontal manner, but to fall away outward at a slight angle of a few degrees.

In this case, it is likewise possible to produce a dopant concentration gradient falling away toward the edge.

In an equivalent way, it is also feasible for the concentration profile of the field stop zone to have a gradient running flat in the lateral direction toward the edge of the power semiconductor component. In this case, corresponding calculations must also be carried out for the laterally averaged surface charge densities.

Furthermore, it is also feasible to provide an electroactive passivation layer in the edge area, as is described in European Patent EP 0 400 178 B1, in addition to providing the the field stop zone.

The invention is particularly suitable for power diodes (pin diodes) with a mesa edge termination, which are used, for example, as freewheeling diodes for IGBTs and GTOs. However, the invention can also be used very advantageously for other asymmetrically blocking power semiconductor components having a mesa edge termination, such as IGBTs, GTOs and the like.

In accordance with an added feature of the invention, the field stop zone, the first zone and the inner zone are spaced apart from one another such that the first zone and the inner zone are isolated in terms of potential.

In accordance with an additional feature of the invention, the field stop zone has a higher dopant concentration than the inner zone and a lower dopant concentration than the first zone.

In accordance with another feature of the invention, the inner zone has a dopant concentration and the field stop zone has a dopant concentration that are set in the edge area such that a surface-related charge during switched-off operation corresponds to a breakdown charge of the power semiconductor component.

In accordance with a further feature of the invention, a dopant concentration of the charge carriers of the first conductivity type in the edge area has a reducing gradient from the first surface in a vertical direction into the semiconductor body.

In accordance with a further added feature of the invention, a dopant concentration of the charge carriers of the first conductivity type in the edge area has a decreasing gradient in the field stop zone in a lateral direction toward an edge of the semiconductor body.

In accordance with a further additional feature of the invention, there is a first electrode. The first zone functions as an additional field stop zone having charge carriers of the first conductivity type and, at the first surface of the semiconductor body is connected to the first electrode. A second electrode is connected to the second zone at the second surface of the semiconductor body.

In accordance with another added feature of the invention, there is a first electrode. The first zone has charge carriers of the second conductivity type and is connected at the first surface to the first electrode. A third zone of the first conductivity type is connected to the second zone at the second surface of the semiconductor body. A second electrode is provided and is connected to the third zone.

In accordance with yet another feature of the invention, there is a buffer layer functioning as an additional field stop zone and is disposed between and spaces the inner zone and the first zone apart from one another.

In accordance with further embodiment of the invention, there is an electroactive passivation layer provided at least on those areas of the first surface which are provided in the edge area.

In accordance with a concomitant feature of the invention, the semiconductor body, the inner zone, the first zone, the second zone, and the field stop zone form a pin diode, an insulated gate bipolar transistor, or a gate turn-off thyristor.

Other features which are considered as characteristic for the invention are set forth in the appended claims.

Although the invention is illustrated and described herein as embodied in-,a power semiconductor component having a mesa edge termination, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, partial sectional view of a first exemplary embodiment of a power semiconductor component according to the invention and in the form of a pin diode;

FIG. 2 is a partial sectional view of a second exemplary embodiment of the power semiconductor component according to the invention and in the form of the pin diode;

FIG. 3 is a partial sectional view of a third exemplary embodiment of the power semiconductor component according to the invention and in the form of a GTO; and FIG. 4 is a partial sectional view of a fourth exemplary embodiment of the power semiconductor component according to the invention and in the form of an IGBT.

DESCRIPTION OF THE PREFERRED EMBODIMENTS

With regard to all the figures in the drawing, it should be noted in advance that, although these are section illustrations, no shading is shown there, for reasons of clarity. In all the figures of the drawing, sub-features and integral parts that correspond to one another bear the same reference symbol in each case. Referring now to the figures of the drawing in detail and first, particularly, to FIG. 1 thereof, there is shown schematically and in a partial sectional view, a first exemplary embodiment of a power semiconductor component according to the invention and in the form of a pin diode.

In FIG. 1, a semiconductor body 1 of a pin diode is shown. The pin diode has an anode connection A and a cathode connection K, which are disposed on opposite sides of the semiconductor body 1.

The semiconductor body 1, by way of example, contains a silicon substrate that has an inner zone 2, which is lightly n-doped in the present exemplary embodiment. On the anode side, a p-doped anode zone 3 is adjacent to the inner zone 2 over a large area. A boundary surface 4, which typically runs laterally over the entire width of the semiconductor body 1 of the pin diode, defines its pn junction 4. On the anode side, the anode zone 3 is adjacent to a rear-face surface 5 of the semiconductor body 1. In this case, the anode zone 3 is connected to the anode connection A via large-area anode metallization, or an anode electrode 6, applied to the surface 5.

On the cathode side, at least one cathode zone 8, which is heavily n-doped in the present case, is embedded in a front-face surface 7 of the semiconductor body 1. The cathode zone 8 is of the same conductivity type as, but has a very much higher dopant concentration than, the inner zone 2 and is thus used as a field stop zone for reducing a field of an electrical field on the front-face surface 7. The cathode zone 8 is at this point embedded in the inner zone 2 like a trough and may, for example, be introduced into the semiconductor body 1 by ion implantation with an optional subsequent temperature step, or by diffusion. The cathode zone 8 is connected to the cathode connection K on the surface 7 via cathode metallization or a cathode electrode 9. The area of the pin diode that is defined by the cathode zone 8 is also referred to as an active area AB of the pin diode.

In the present exemplary embodiment, an area 10 which is etched out of the semiconductor body 1 is provided in an edge area RB, which is essentially defined by those areas of the semiconductor body 1 which are located outside the active area AB. The process of etching out the areas 10 in the edge area RB defines an etched shoulder 12 between the cathode zone 8 and the edge area RB. The etched shoulders 12 and the etched-polished surfaces 7' produced in this way run essentially horizontally in the example in FIG. 1. It would, of course, also be feasible for the etched shoulders 12 to have a profile slightly inclined toward the edge.

An n-doped field stop zone 11 is provided in the areas located underneath the etched shoulders 12. In this case, the field stop zone 11 is of the same conductivity type as the inner zone 2 and the cathode zone 8. The field stop zone 11 is connected to the cathode zone 8, and is disposed between the etched-polished surfaces 7' and the inner zone 2. It is particularly advantageous for a dopant concentration of the field stop zone 11 to be less than that of the cathode zone 8 and higher than that of the inner zone 2. This makes it possible to ensure that a flat dopant concentration gradient is produced from the surface 7' to the inner zone 2 in the edge area RB of the pin diode.

In the present exemplary embodiment, the field stop zone 11 has homogeneous n-doping. In a development, it would also be highly advantageous for the field stop zone 11 to have a dopant concentration that reduces slowly toward the edge.

The pin diode in FIG. 1 is formed using a so-called mesa structure. Such mesa structures have a typically positive chamfer on side walls 13 of the semiconductor body 1. In the present exemplary embodiment, a chamfer angle of the side wall 13 is denoted by α. Typical values for the chamfer angle α of a mesa structure are between 20 and 45°.

In the exemplary embodiment in FIG. 1, the field stop zones 11 are provided only in the edge area RB of the semiconductor component. It would, of course, also be feasible for the field stop zone 11 to be disposed as a continuous layer over the entire width of the semiconductor body 1. This situation is shown in the exemplary embodiment in FIG. 2. Here, the field stop zone 11 is disposed not only in the edge area RB but also in the active area AB of the pin diode. Particularly in the active area AB of the pin diode, the field stop zone 11 thus spaces the cathode zone 8 and the inner zone 2 apart from one another.

In the embodiment of the pin diode shown in FIG. 1, the field stop zone 11 can advantageously be introduced into the semiconductor body 1 after etching away the areas 10 in a self-adjusting manner by using the cathode electrode 9 as a mask.

In the embodiment of the pin diode shown in FIG. 2, a field stop zone 11 is provided which has been incorporated into the semiconductor body 1 over a large area. The cathode zone 8 is then applied over a large area onto the field stop zone 11, for example via a deposition process. Finally, in order to produce polished, damage-free surfaces 7' in the edge area RB of the pin diode, the corresponding areas 10 are etched out of the semiconductor body 1.

In addition to the field stop zone 11 provided in the edge area RB in FIGS. 1 and 2 it is possible, as already mentioned initially, for electroactive passivation layers 7", for example composed of an amorphous carbon compound, to be applied to the surfaces 7'.

The operation of the field stop zone 11 according to the invention in the pin diode shown in FIG. 3 or 4 is now described in more detail.

In semiconductor components having the high-blocking-capable pn junctions 4, measures have to be taken to reduce the field of the electrical field on the surface 7, 7'. In the pin diode structure dimensioned on the punch through basis, the space charge zone abuts against the field stop zone during switched-off operation. The field stop zone is typically formed by the emitter (cathode) zone 8 in a pin diode of this generic type. The space charge zone is trapped by the field stop zone, which is in the form of the emitter zone 8. The electrical field increases in the emitter zone 8, resulting in the electrical field having a trapezoidal field profile in the volume of the semiconductor body 1. The trapezoidal field profile results in the electrical field being reduced toward the surface 7 of the semiconductor body 1.

However, in the edge area RB of the power semiconductor component, the field profile is no longer trapezoidal owing to the lack of any emitter zone 8 there, and thus owing to the lack of the required field stop zone. In fact, the increase in the electrical field here leads to some extreme field peaks on the etched shoulders 12. In order to prevent any undesirable, that is to say premature, voltage breakdown in the edge area RB even at low blocking voltages, the field stop zones 11 according to the invention are in this case incorporated in the semiconductor body 1 in the areas underneath the etched shoulders 12. In this case, it should be remembered that the field stop zones 11 are not interrupted, that is to say they must be connected directly to the emitter zone 8, which is likewise in the form of a field stop zone, and to the inner zone 2. This will ensure that a trapezoidal field profile is produced over the entire width of the semiconductor body 1 from the pn junction toward the surface 7, 7', thus avoiding field peaks in the edge area RB.

The present invention is not exclusively limited to power semiconductor components in the form of pin diodes, but can also highly advantageously be used with other power semiconductor components. FIGS. 3 and 4 show two further advantageous exemplary embodiments.

FIG. 3 shows, schematically and in a partial section, an exemplary embodiment of a power semiconductor component in the form of a gate turn-off thyristor (GTO) and having an edge termination according to the invention.

The GTO which in this case is in the form of an asymmetrically blocking thyristor, has an anode connection A and a cathode connection K on opposite sides of the semiconductor body 1.

The semiconductor body 1 contains an n-doped n-base zone 20. On a cathode side, a p-doped p-base zone 22 is connected to the n-base zone 20 via a large-area pn junction 21. A heavily n-doped n-emitter zone 23 is connected to the p-base zone 22. The n-emitter zone 23 is connected to the cathode connection K via cathode metallization or a cathode electrode 24 on a rear-face surface 25.

On the anode side, a p-doped p-emitter zone 26 is embedded in a front-face surface 27 of the semiconductor body 1 in the active area AB of the thyristor. The p-emitter zone 26 is in this case connected to the anode connection A via large-area anode metallization or an anode electrode 28. Furthermore in FIG. 3, the p-emitter zone 26 is spaced apart from the n-base zone 20 via a buffer layer 29. The p-emitter zone 26 and thus the anode electrode 28 can be connected to the n-base zone 20 via at least one through contact 30. The buffer zone 29 in the anode-side area of the semiconductor component is thus used as a field stop zone during switched-off operation. In principle, a continuous emitter without any anode short circuits is also feasible.

In the present exemplary embodiment, the thyristor has a so-called transparent emitter, that is to say the anode-side buffer layer 29 with anode short circuits 30. With such transparent emitters, p-emitter zones 26 are not completely healed after the ion implantation, in order to ensure a low level of charge carrier injection, in this way. These measures are carried out with thyristors and GTOs of this generic type in order to allow on and off-switching in a defined manner. Instead of such a transparent emitter, it would also alternatively be feasible to blow helium over the areas underneath the anode-side p-emitter zone 26 in order in this way to produce a recombination sink.

In the edge area RB, that is to say outside the active area AB of the thyristor, areas 31 etched out of the semiconductor body 1 are provided in an equivalent way to that for the diode structures in FIGS. 1 and 2. These are disposed under etched-polished surfaces 27' of etched shoulders 33 produced by the etched-out areas 31. In this case, field stop zones 32 are connected to the p-emitter zone 26. The field stop zones 32 are n-doped and have a higher dopant concentration than the n-base zone 20.

In the present exemplary embodiment, the thyristor is represented as an asymmetric thyristor with the field stop zone or the buffer layer 29. In order to avoid anode-side gain $\alpha_{pnp}$ disappearing completely, the amount of charge in the field stop zone 29 must not be greater than the breakdown charge, with structures short-circuited on the anode side.

The method of operation of the field stop zone 32 according to the invention in the edge area of the semiconductor component is equivalent to the method of operation of the field stop zone 11 of the pin diodes shown in FIGS. 1 and 2. In particular, the complete volume blocking capability can be ensured, even in the edge area RB of the semiconductor component, via the doped field stop zones 32 in a thyristor or GTO, in an equivalent way to that in a pin diode.

The exemplary embodiment of the thyristor illustrated in FIG. 3 shows only one possible advantageous embodiment. The edge structure according to the invention can also, of course, highly advantageously be used in all other thyristors of vertical construction with an edge termination, in particular GTOs as well as monolithically integrated systems, such as reverse-conducting thyristors.

FIG. 4 shows, schematically and in a partial section, an exemplary embodiment of a power semiconductor component according to the invention and in the form of an insulated gate bipolar transistor (IGBT), in which the edge structure according to the invention is likewise used.

The IGBT in FIG. 4 is constructed in a known manner. Since the four-layer structure of the IGBT shown in FIG. 4 is constructed in a similar way to the four-layer structure of the thyristor shown in FIG. 3, the following text describes in detail only those features which are different to those of the thyristor in FIG. 3.

The p-base zones 22, which are typically in the form of a trough in an IGBT, are embedded in the semiconductor body 1 on the surface 25 of the semiconductor body 1 in a known manner. The heavily n-doped n-emitter zones 23 are embedded in the form of a trough in these p-base zones 22. The p-base zone 22 and the n-emitter zones 23 are connected to one another in a known manner on the surface 25 via a cathode electrode 35 in the form of a shunt connection. An MOS structure is also provided here. The MOS structure contains a gate electrode 36 and a gate oxide 37, which are in each case disposed above those areas of the n-base zone 20, p-base zone 21 and n-emitter zone 22 which appear on the surface 25.

The p-emitter zone 26 disposed on the surface 27 is in the form of a collector in the IGBT. In contrast to the GTO in FIG. 3, the IGBT in FIG. 4 has no through contacts 30 between the p-collector zone 26 and the n-base zone 20. In principle, of course, an IGBT with a continuous transparent emitter with an anode short circuit would also be feasible.

In the IGBT shown in FIG. 4, the buffer zone 29 is used in an equivalent manner to that in the thyristor in FIG. 3 as a field stop zone to reduce the electrical field on the wafer surface. The function of the field stop zone 32 according to the invention is in this case equivalent to that in the above-mentioned examples of a pin diode as shown in FIG. 1 or 2, or the GTO as shown in FIG. 3.

In the high-voltage-resistant power semiconductor components illustrated in FIGS. 1 to 4, the edge areas RB of these components are formed using a mesa structure. The present invention can, of course, also be applied highly advantageously to power semiconductor components having edge terminations formed in any way whatsoever, as well.

The above-mentioned exemplary embodiments are intended to be regarded as the essential features of the invention. However, it can easily be seen from FIGS. 1 to 4 how other possible exemplary embodiments of the semiconductor components according to the invention may appear. These are, in general, any desired asymmetrically blocking semiconductor components, such as diodes, thyristors, transistors, IGBTs or the like.

We claim:

1. An asymmetric power semiconductor component having a mesa edge termination, comprising:
  a semiconductor body having a first surface and a second surface;
  at least one inner zone of a first conductivity type disposed in said semiconductor body;
  at least one first zone disposed in said semiconductor body and connected to said inner zone and adjacent said first surface of said semiconductor body, said semiconductor body having an edge area outside of said first zone and areas at least partially etched out from said first surface formed in said edge area;

at least one second zone of a second conductivity type disposed in said semiconductor body and connected over a large area to said inner zone, and a boundary area between said second zone and said inner zone defining a pn junction;

at least one field stop zone adjacent said first surface in said edge area, said field stop zone formed of the first conductivity type and embedded in said semiconductor body, said field stop zone connected to said first zone and to said inner zone, said field stop zone having a higher dopant concentration than said inner zone; and an electroactive passivation layer provided at least on the areas of said first surface in said edge area;

said dopant concentration of said field stop zone being set by a suitable dopant concentration profile during diffusion causing a surface-related charge during switched-off operation to correspond to a breakdown charge of the power semiconductor component.

2. The power semiconductor component according to claim 1, wherein said field stop zone, said first zone and said inner zone are disposed relative to one another such that said first zone and said inner zone are isolated in terms of potential.

3. The power semiconductor component according to claim 1, wherein a dopant concentration of charge carriers of the first conductivity type in said edge area has a reducing gradient from a top surface of said field stop zone in a vertical direction into said semiconductor body.

4. The power semiconductor component according to claim 1, wherein a dopant concentration of charge carriers of the first conductivity type in said edge area has a decreasing gradient in said field stop zone in a lateral direction toward an edge of said semiconductor body.

5. The power semiconductor component according to claim 1, including:

a first electrode, said first zone functioning as an additional field stop zone having charge carriers of said first conductivity type and, said first surface of said semiconductor body is connected to said first electrode; and a second electrode connected to said second zone at said second surface of said semiconductor body.

6. The power semiconductor component according to claim 1, including:

a first electrode, said first zone having charge carriers of said second conductivity type and connected at said first surface to said first electrode;

a third zone of said first conductivity type connected to said second zone at said second surface of said semiconductor body; and a second electrode connected to said third zone.

7. The power semiconductor component according to claim 6, including a buffer layer functioning as an additional field stop zone and disposed between and spaces said inner zone and said first zone apart from one another.

8. The power semiconductor component according to claim 1, wherein said field stop zone has a lower dopant concentration than said first zone.

9. The power semiconductor component according to claim 1, wherein said semiconductor body, said inner zone, said first zone, said second zone, and said field stop zone form a pin diode.

10. The power semiconductor component according to claim 1, wherein said semiconductor body, said inner zone, said first zone, said second zone, and said field stop zone form an insulated gate bipolar transistor.

11. The power semiconductor component according to claim 1, wherein said semiconductor body, said inner zone, said first zone, said second zone, and said field stop zone form a gate turn-off thyristor.

* * * * *

UNITED STATES PATENT AND TRADEMARK OFFICE
CERTIFICATE OF CORRECTION

PATENT NO. : 6,696,705 B1  Page 1 of 1
DATED : February 24, 2004
INVENTOR(S) : Reiner Barthelmess et al.

It is certified that error appears in the above-identified patent and that said Letters Patent is hereby corrected as shown below:

<u>Title page</u>,
Item [30], Foreign Application Priority Data, should read as follows:
-- Jan. 12, 1999    [DE]    …….. 199 00 808 --

Signed and Sealed this

Twenty-seventh Day of April, 2004

JON W. DUDAS
*Acting Director of the United States Patent and Trademark Office*